(12) United States Patent
Willemen (10) Patent No.: US 8,854,103 B2
(45) Date of Patent: Oct. 7, 2014

(54) CLAMPING CIRCUIT

(75) Inventor: Joost Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 13/432,411

(22) Filed: Mar. 28, 2012

(65) Prior Publication Data

US 2013/0257504 A1 Oct. 3, 2013

(51) Int. Cl.
*H03L 5/00* (2006.01)

(52) U.S. Cl.
USPC ........... 327/318; 327/310; 327/324; 327/330; 361/56; 361/220

(58) Field of Classification Search
USPC ................. 327/309, 310, 318–322, 324, 330; 361/54–57, 212, 220
See application file for complete search history.

(56) References Cited

U.S. PATENT DOCUMENTS

| | | | |
|---|---|---|---|
| 5,500,546 A | 3/1996 | Marum et al. | |
| 5,978,192 A | 11/1999 | Young et al. | |
| 6,147,852 A * | 11/2000 | Ravanelli | 361/111 |
| 6,501,632 B1 * | 12/2002 | Avery et al. | 361/111 |
| 6,958,896 B2 | 10/2005 | Lin et al. | |
| 7,068,482 B2 * | 6/2006 | Chen | 361/56 |
| 7,615,417 B2 * | 11/2009 | Manna et al. | 438/133 |
| 7,617,467 B2 * | 11/2009 | Bell et al. | 716/106 |
| 7,763,940 B2 * | 7/2010 | Mergens et al. | 257/355 |
| 7,782,579 B2 * | 8/2010 | Kato | 361/56 |
| 7,858,469 B1 * | 12/2010 | Watt et al. | 438/237 |
| 7,911,748 B1 * | 3/2011 | Chu et al. | 361/56 |
| 8,144,441 B2 * | 3/2012 | Ping et al. | 361/56 |
| 8,526,147 B2 * | 9/2013 | Gallerano et al. | 361/56 |
| 8,633,543 B2 * | 1/2014 | Ohta et al. | 257/355 |
| 8,638,533 B2 * | 1/2014 | Uenishi | 361/56 |
| 8,643,990 B2 * | 2/2014 | Cao et al. | 361/91.1 |
| 2005/0212051 A1 * | 9/2005 | Jozwiak et al. | 257/355 |
| 2008/0062595 A1 * | 3/2008 | Ping et al. | 361/56 |
| 2009/0244797 A1 * | 10/2009 | Sawahata | 361/56 |
| 2009/0268357 A1 * | 10/2009 | Reynders et al. | 361/56 |
| 2010/0302693 A1 * | 12/2010 | Hayashi | 361/56 |
| 2011/0096446 A1 * | 4/2011 | Croft | 361/56 |
| 2011/0304940 A1 | 12/2011 | Cao et al. | |
| 2013/0056792 A1 * | 3/2013 | Besse et al. | 257/146 |

FOREIGN PATENT DOCUMENTS

DE  10 2010 030 064 A1  12/2011
EP       1 873 917 A1    1/2008

* cited by examiner

*Primary Examiner* — William Hernandez
(74) *Attorney, Agent, or Firm* — Slater & Matsil, L.L.P.

(57) ABSTRACT

A clamping circuit includes a clamping element with a control terminal and a load path that is coupled between a first circuit node and a second circuit node. A control circuit is coupled between the first circuit node and the second circuit node and is also coupled to the control terminal of the clamping element. The control circuit includes at least one snap-back unit with two load terminals and is only coupled between the first circuit node and the control terminal of the clamping element. The snap-back unit has an electrical resistance between the two load terminals and is configured to reduce the electrical resistance when a voltage between the two load terminals reaches a given threshold value.

21 Claims, 4 Drawing Sheets

CLAMPING CIRCUIT

TECHNICAL FIELD

Embodiments of the present invention relate to a clamping circuit, such as an electrostatic discharge (ESD) protection circuit.

BACKGROUND

Voltage or current spikes (energy spikes) or voltage or current pulses, such as voltage or current pulses caused by electrostatic discharge (ESD) events or by electrical overstress (EOS) may cause damages or reliability problems in semiconductor devices or in integrated circuits (ICs) that include several semiconductor devices. In an ESD process electric charge is transferred in a short time from an object, such as a charged person, a charged electrical cable, or charged manufacturing equipment, to a circuit node connected to the semiconductor device or the IC. A voltage or current spike may damage or destroy the semiconductor device or the IC. Damages induced by voltage or current spikes are, for example, interruption of a connection line by melting the connection line; failure caused by thermal semiconductor junction burn-out; or destruction or degradation of a gate oxide of a semiconductor device such as MOSFET (Metal-Oxide Field-Effect Transistor) or an IGBT (Insulated Gate Bipolar Transistor).

Different concepts are known for protecting semiconductor devices or ICs against energy spikes, such as voltage or current spikes resulting from ESD events. According to a first concept, at least one diode, such as a Zener diode or an avalanche diode is connected in parallel to the semiconductor device or IC that is to be protected. For ESD protection purposes the diode is operated in reverse-bias mode and breaks down when a voltage spike occurs that has an amplitude higher than a voltage blocking capability of the diode. When the diode breaks down it conducts a current resulting from an ESD event and protects the semiconductor device or IC against overvoltages by clamping the voltage to a safe level.

According to a further concept, a transistor, such as a MOSFET or an IGBT, has its load path connected in parallel to the semiconductor device or the IC to be protected. Further, a control circuit is connected in parallel to the load path of the transistor and is configured to control (drive in the on-state) the transistor when the voltage across the load path reaches a given voltage threshold. In the on-state, the transistor provides a low-ohmic current path for conducting the current occurring in connection with the ESD event. Transistors usually have an electrical safe operating area (eSOA) that defines the load currents and the corresponding load voltages at which the transistor can be safely operated. The control circuit should, therefore, be implemented such that the transistor is not operated outside the eSOA.

SUMMARY OF THE INVENTION

One embodiment of the invention relates to a clamping circuit. The clamping circuit includes a clamping element having a control terminal and a load path connected between a first circuit node and a second circuit node. A control circuit is coupled between the first and the second load terminals and is coupled to the control terminal of the clamping element. The control circuit includes at least one snap-back unit comprising two load terminals and only coupled between the first circuit node and the control terminal of the clamping element, the snap-back unit having an electrical resistance between the two load terminals and configured to reduce the electrical resistance when a voltage between the two load terminals reaches a given threshold value.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 9 that includes

FIG. 10 that includes

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
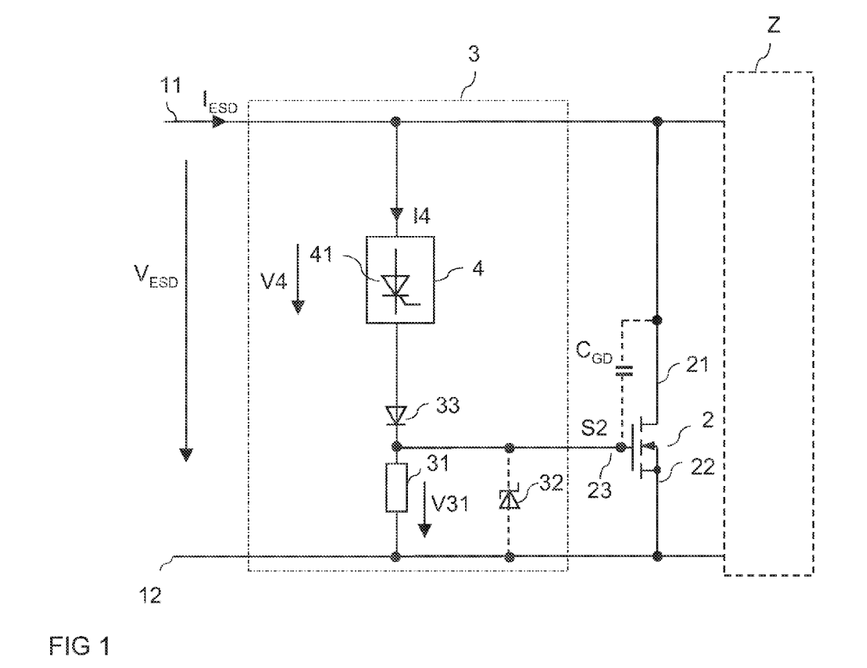
FIG. 1 schematically illustrates a first embodiment of a clamping circuit including a controllable clamping element implemented as a transistor and a control circuit with a snap-back unit.

FIG. 1 schematically illustrates a first embodiment of a clamping circuit for protecting a semiconductor device or an integrated circuit against overvoltages, in particular against overvoltages resulting from electrostatic discharges (ESD).

The clamping circuit includes a first and a second circuit node 11, 12. A semiconductor device or an integrated circuit that is to be protected can be connected between the first and the second circuit nodes 11, 12. In the following, the term "circuit to be protected" will be used for a circuit including several devices as well for a circuit including only one device. Such circuit Z is illustrated in dashed lines in FIG. 1.

Referring to FIG. 1, the protection circuit includes a clamping element 2 having a load path between a first load terminal 21 and a second load terminal 22, and a control terminal 23. The load path 21, 22 is connected between the first and second circuit nodes 11, 12. The clamping element 2 can be driven in an on-state and an off-state. In the on-state, the clamping element provides a (low-ohmic) current conducting path between the first and second circuit nodes 11, 12. Thus, the clamping element 2 in the on-state allows a current to flow between the first and second circuit nodes 11, 12. In the off-state, the clamping element 2 is high-ohmic and prevents a current to flow between the first and second circuit nodes 11, 12. The clamping element is controlled through a drive signal S2 at the control terminal 23. The parasitic gate-to-drain capacitance $C_{GD}$ is also illustrated in FIG. 1.

The clamping element 2 can be implemented as a transistor, such as a MOSFET (Metal Oxide Semiconductor Field-Effect Transistor), as illustrated in FIG. 1, an IGBT (Insulated Gate Bipolar Transistor), a Bipolar Junction Transistor (BJT), or the like. Just for explanation purposes it is assumed that the clamping element is implemented as a MOSFET, as illustrated in FIG. 1. The MOSFET includes drain and source terminals that form the first and second load terminals 21, 22, and a gate terminal that forms the control terminal 23. The MOSFET is driven in the on-state or the off-state dependent on a drive signal S2 applied to its control terminal 23. A control circuit 3 that is connected between the first and second circuit nodes 11, 12 provides the drive signal S2. The MOSFET is in the off-state, when the (absolute value of the) drive signal S2 is below a threshold value, and is in the on-state, when the drive signal is above the threshold value. In the on-state, the electrical resistance of the load path 21-22 of the MOSFET 2 may vary depending on the drive signal S2. The control circuit 3 is implemented such that it operates the MOSFET within the boundaries defined by the MOSFET's electrical safe operating area (eSOA). The eSOA of the MOSFET will be explained with reference to FIG. 2.

Figure 2:
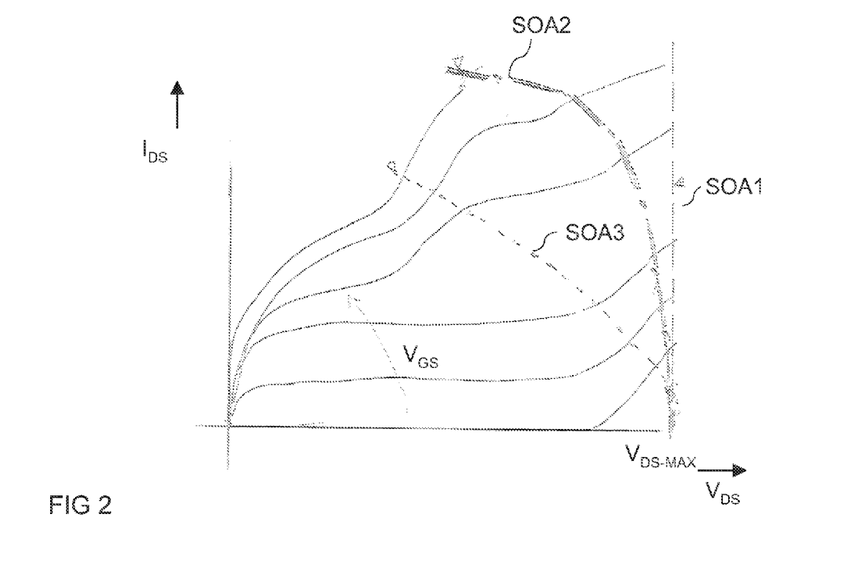
FIG. 2 schematically illustrates exemplary characteristic curves of a controllable clamping element (here exemplary shown are MOSFET characteristics) and the electrical safe operating area (eSOA) of the MOSFET.

FIG. 2 schematically illustrates exemplary characteristic curves of the MOSFET. Each of the characteristic curves illustrated in FIG. 2 shows the load current $I_{DS}$ of the MOSFET dependent on the load voltage $V_{DS}$ at one given gate-source-voltage $V_{GS}$. The gate-source-voltage $V_{GS}$ corresponds to the drive signal S2 illustrated in FIG. 1. As can be seen from the characteristic curves illustrated in FIG. 2, at a given load voltage $V_{DS}$ the load current $I_{DS}$ increases when the gate-source-voltage $V_{GS}$ increases.

Theoretically, the MOSFET can be operated at load voltages $V_{DS}$ below a maximum voltage $V_{DS-MAX}$ that defines the voltage blocking capability of the MOSFET. In this ideal case, the safe operating SOA1 area includes all load voltages and corresponding load currents below the maximum voltage $V_{DS-MAX}$.

In real MOSFETs, however, the eSOA, for example, has a shape as illustrated by the dash-dot line (SOA2) or by the dashed line (SOA3) in FIG. 2. While the MOSFET tolerates the maximum load voltage $V_{DS-MAX}$ at low gate-source voltages $V_{GS}$, the tolerated load voltage $V_{DS}$ decreases when the gate-source voltage $V_{GS}$ increases.

Referring to FIG. 1, the control circuit includes a least one snap-back unit 4 coupled between the first circuit node 11 and the control terminal 23 of the clamping element. The snap-back unit 4 includes either one or more of the following: a thyristor; a 4-layer diode; a bipolar junction transistor; or any other semiconductor device that shows a snap-back effect. Further, a resistive element, such as a resistor 31 is connected between the control terminal 23 of the clamping element 2 and the second circuit node 12. Optionally, a voltage limiting element, such as a Zener diode 32 is connected in parallel to the resistive element 31 and between the control terminal 23 and the second circuit node 12. Further, an optional rectifier element 33, such as a diode, is connected in series with the snap-back unit 4. The rectifier element 33 is connected such that it prevents a current flow from the control terminal 23 to the first circuit node 11.

Figure 3:
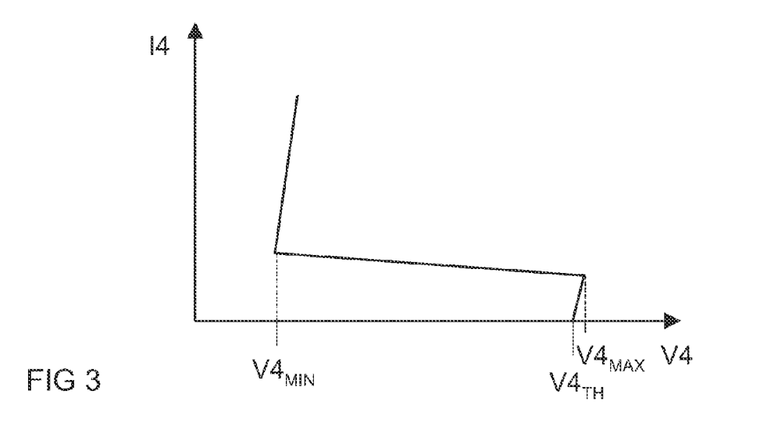
FIG. 3 schematically illustrates the characteristic curve of the snap-back unit according to one embodiment.

FIG. 3 illustrates an exemplary characteristic curve of the snap-back unit 4. This characteristic curve shows a current I4 through the snap-back unit 4 depending on a voltage V4 across the snap-back unit 4. Referring to FIG. 3 the snap-back unit 4 starts to conduct a current when the voltage V4 reaches a threshold value $V4_{TH}$. When the current I4 through the snap-back unit 4 increases the voltage V4 further increases until the voltage V4 reaches a maximum value $V4_{MAX}$. At this point, the voltage V4 "snaps-back" to a minimum value $V4_{MIN}$ below the maximum value $V4_{MAX}$ from where it may increase when the current further increases.

The operating principle of the clamping circuit of FIG. 1 is now explained with reference to FIGS. 1 and 3. For explanation purposes it is assumed that a current pulse $I_{ESD}$ such as a current pulse resulting from an ESD event, is applied between the first and second circuit nodes 11, 12. This current pulse $I_{ESD}$ causes a voltage $V_{ESD}$ between the first and second circuit nodes 11, 12 to increase. When this voltage reaches an amplitude such that the voltage V4 across the snap-back unit 4 reaches the threshold voltage $V4_{TH}$ of the snap-back unit 4, a current flows through the series circuit consisting of the snap-back unit 4 and the resistance element 31. This current causes a voltage drop V31 across the resistance element 31. When the amplitude of the voltage $V_{ESD}$ increases so that the voltage across the resistance element 31 reaches the threshold voltage of the transistor 2, the transistor 2 is switched on so as to provide a current path between the first and second circuit nodes 11, 12 and so as to clamp the voltage between the first and second circuit nodes.

When the amplitude of the voltage $V_{ESD}$ further increases, so that the voltage V4 across the snap-back unit 4 reaches the maximum voltage $V4_{MAX}$ the voltage V4 across the snap-back unit 4 rapidly decreases, so that the voltage V31 rapidly increases. The rapid increase of the voltage V31 across the resistance element causes the transistor 2 to be switched on with an even lower on-resistance, so that the transistor 2 provides a current path between the first and second circuit node 11, 12 with an even lower ohmic resistance. Consequently, the clamping voltage that occurs while diverting the ESD pulse decreases.

Figure 4:
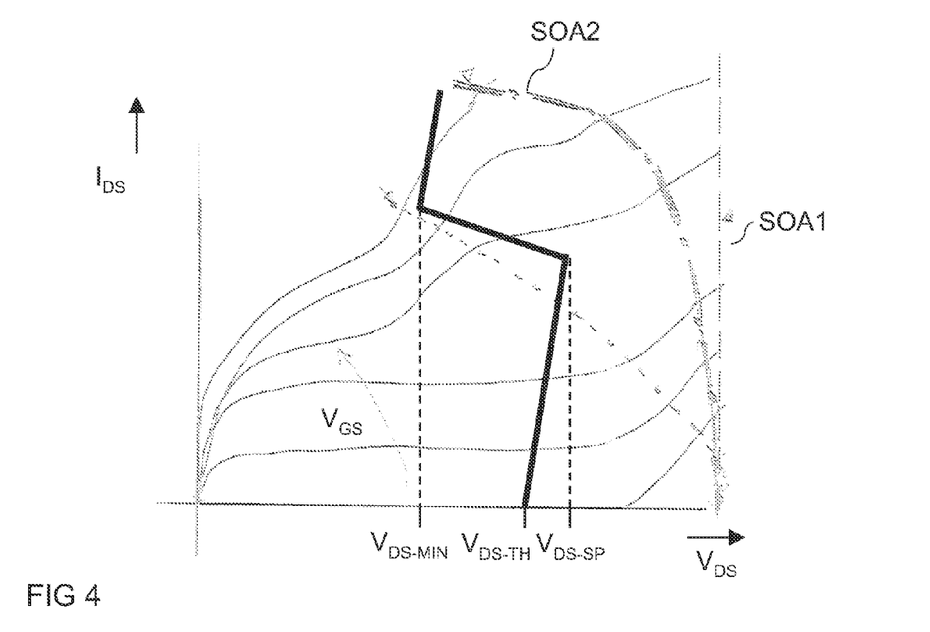
FIG. 4 schematically illustrates the current-voltage characteristics of a clamping circuit as illustrated in FIG. 1 within the operating limits of the clamping element (here a MOSFET), which are defined by SOA2.

The influence of the snap-back unit 4 on the operation state of the transistor 2 is now explained with reference to FIG. 4. FIG. 4 illustrates the characteristic curves of the transistor 2 as explained with reference to FIG. 2 and further illustrates in bold lines the possible operation states of the transistor 2 driven by a control circuit including a snap-back unit 4, such as the control circuit 3 illustrated in FIG. 1. The operating states of the transistor 2 are defined by the load voltage $V_{DS}$, the corresponding load current $I_{DS}$ and the corresponding gate-source-voltage $V_{GS}$. These operating states are defined by the control circuit and are arranged on the curve represented by the curve illustrated in bold lines in FIG. 4. The load voltage $V_{DS}$ of the transistor 2 corresponds to the voltage $V_{ESD}$ between the first and second circuit nodes 11, 12.

Referring to FIG. 4, the load current $I_{DS}$ through the transistor 2 is zero (0) when the load voltage $V_{DS}$ is below a threshold voltage $V_{DS-TH}$. When the amplitude of the load voltage $V_{DS}$ reaches a threshold voltage $V_{DS-TH}$, the transistor is switched on. Referring to FIGS. 1 and 3, the threshold voltage $V_{DS-TH}$ corresponds to the threshold voltage $V4_{TH}$ of the snap-back unit 4 plus the threshold voltage of the transistor 2 plus the forward voltage of the optional diode 33. The threshold voltage of the transistor 2 is the gate-source-voltage $V_{GS}$ at which the transistor 2 switches on.

When the load voltage $V_{DS}$ increases, the current through the series circuit including the snap-back unit 4 and the resistance element 31 increases, leading to an increase of the voltage V31 and the gate-source-voltage $V_{GS}$ of the transistor 2 and an increase of the load current $I_{DS}$. An increase of the load voltage $V_{DS}$ not only results in an increase of the gate-source-voltage $V_{GS}$ but also results in an increase of the current I4 through and the voltage V4 across the snap-back unit 4. When the load voltage $V_{DS}$ reaches a snap-back voltage $V_{DS-SP}$ at which the voltage V4 across the snap-back unit 4 reaches the maximum voltage $V4_{MAX}$ the voltage V4 across the snap-back unit 4 rapidly decreases. This causes an increase of the gate-source voltage $V_{GS}$ of the transistor 2, so that the on-resistance of the transistor 2 decreases, which causes an increased load current $I_{DS}$ and which also causes a decrease of the load voltage $V_{DS}$. Further, the current resulting from the ESD pulse is diverted at a lower clamping voltage between the first and second circuit nodes 11, 12. In FIG. 4, $V_{DS-MIN}$ denotes the load voltage $V_{DS}$ that sets in after the snap-back effect of the snap-back unit 4 has occurred. Starting from this voltage $V_{DS-MIN}$ the load voltage $V_{DS}$ may again increase when the load current $I_{DS}$ increases.

As can be seen from FIG. 4, the snap-back unit 4 causes a snap-back of the operation curve of the transistor 2. This snap-back of the operation curves helps to safely operate the transistor 2 within the eSOA. By suitably adjusting the parameters of the snap-back unit 4, the operation curve can be adjusted such that the operation curve is within the eSOA.

Figure 5:
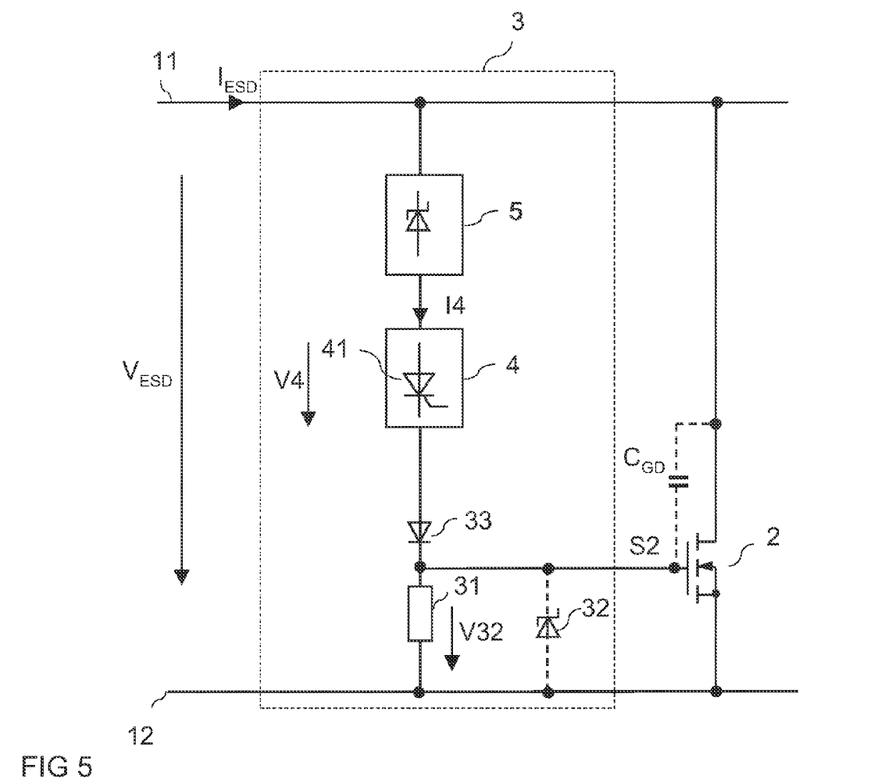
FIG. 5 illustrates a second embodiment of a clamping circuit.

FIG. 5 illustrates a further embodiment of an clamping circuit. In this clamping circuit the control circuit 3 includes a clamping voltage adjusting unit 5 connected in series with the snap-back unit 4. The voltage adjusting unit 5 includes, for example, at least one Zener diode 32. The voltage adjusting unit 5 helps to adjust the threshold voltage $V_{DS-TH}$ at which the transistor 2 is switched on. When the control circuit 3 includes the voltage adjusting unit 5, the transistor 2 is switched on when the load voltage $V_{DS}$ equals the threshold voltage $V4_{TH}$ of the snap-back unit, plus the threshold voltage of the transistor 2, plus the forward voltage of the optional diode 33, plus the voltage adjusting voltage of the voltage adjusting unit 5. The resulting increase in clamping voltage by applying the voltage adjusting unit 5 is, for example, the Zener voltage of the at least one Zener diode implemented in the voltage adjusting unit 5. Instead of a Zener diode, an avalanche diode can be implemented in the voltage adjusting unit 5. The threshold voltage $V_{DS-TH}$ of the clamping circuit of FIG. 5 can be adjusted by suitably selecting the number of Zener diodes or avalanche diodes connected in series and by suitably selecting the breakdown voltage of the Zener diodes or avalanche diodes that are used in voltage adjusting unit 5.

Figure 6:
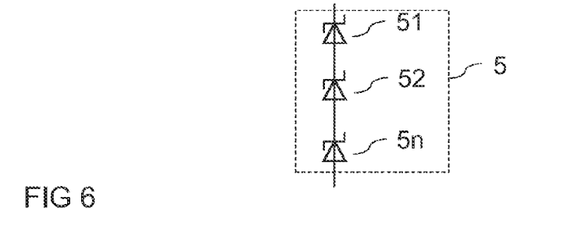
FIG. 6 illustrates an embodiment of a clamping voltage adjusting unit of the clamping circuit of FIG. 5.

One possible embodiment of the voltage adjusting unit 5 is illustrated in FIG. 6. In this embodiment, the voltage adjusting unit 5 includes a plurality of n Zener diodes 51, 52, 5n, connected in series. The amount of clamping voltage adjustment of this voltage adjusting unit 5 corresponds to the sum of the Zener voltages of the individual Zener diodes.

The snap-back unit 4 can be implemented in many different ways. Some embodiments are explained with reference to FIGS. 7 to 12 in the following.

Figure 7:
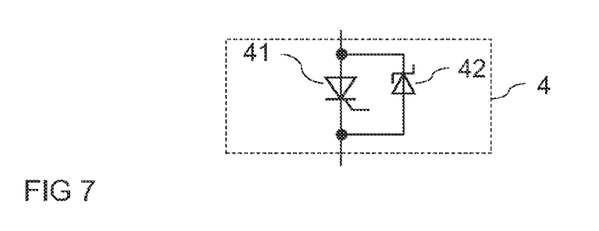
FIG. 7 illustrates a first embodiment of the snap-back unit.

Referring to a first embodiment illustrated in FIG. 7, the snap-back unit 4 includes a thyristor 41 and at least one Zener diode 42 connected in parallel with the thyristor 41. Although FIG. 7 shows only one Zener diode 42 connected in parallel with the thyristor 41, a series circuit with a plurality of Zener diodes may be connected in parallel with the thyristor 41 as well. In the snap-back unit according to FIG. 7, the threshold voltage $V4_{TH}$ of the snap-back unit 4 corresponds to the Zener voltage of the at least one Zener diode 42. When a current flows through the Zener diode 42 in the reverse direction, the voltage V4 across the parallel circuit with the thyristor 41 and the Zener diode 42 increases when the current I4 through the snap-back unit 4 increases. The maximum voltage $V4_{MAX}$ of the snap-back unit 4 corresponds to the self-triggering voltage of the thyristor 41, which is the voltage between the load terminals of the thyristor 41 at which the thyristor triggers (switches on) and bypasses the Zener diode 42 by providing a current path that conducts at a lower voltage difference across the snapback unit 4. When employing the snap-back unit 4 of FIG. 7 in the circuit of FIG. 5, the anode of the thyristor 41 is coupled to the first circuit node 11 while the cathode of the thyristor 41 is coupled to the second circuit node 12. Further, the anode of the thyristor is connected to the cathode of the Zener diode 42, and the cathode of the thyristor 41 is connected to the anode of the Zener diode 42.

When the thyristor 41 switches on, the voltage V4 across the snap-back unit decreases. This voltage $V4_{MIN}$ roughly corresponds to the holding voltage plus the product of the differential on-resistance of the thyristor and the current I4 through the snap-back unit 4.

Figure 8:
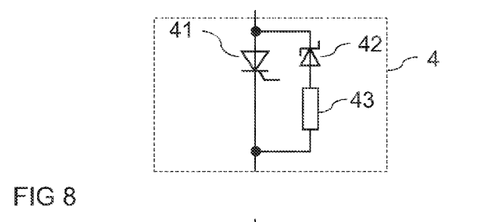
FIG. 8 illustrates a second embodiment of the snap-back unit.

FIG. 8 illustrates a modification of the snap-back unit of FIG. 7. In this snap-back unit of FIG. 8, a resistance element 43, such as a resistor, is connected in series with the at least one Zener diode 42. The series circuit with the at least one Zener diode 42 and the resistance element 43 is connected in parallel with the thyristor 41. While in the snap-back unit of FIG. 7 the increase of the voltage V4 before the thyristor 41 triggers is only dependent on the increase of the current I4 and the differential resistance of the Zener diode 42 operated in reverse breakdown, the increase of the voltage V4 in the snap-back unit 4 of FIG. 8 can additionally be adjusted by the resistor 43.

In the snap-back unit 4 of FIG. 7 as well as in the snap-back unit 4 of FIG. 8, the thyristor 41 and the at least one Zener diode 42 are selected such that the self-triggering voltage of the thyristor 41 is higher than the Zener voltage of the at least one Zener diode 42 or the sum of the Zener voltages of the plurality of Zener diodes connected in series.

Figure 9A:
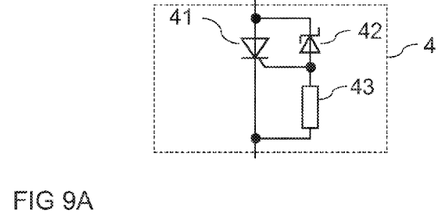
FIGS. 9A and 9B illustrate a third embodiment of the snap-back unit and a modification of the third embodiment.

FIG. 9A illustrates a further embodiment of a snap-back unit 4. In this snap-back unit, the resistance element 43 is connected between the gate terminal and the cathode terminal of the thyristor 41, and the at least one Zener diode 42 is connected between the anode terminal and the gate terminal of the thyristor 41. The threshold voltage $V4_{TH}$ of the snap-back unit of FIG. 9 corresponds to the Zener voltage of the Zener diode 42.

Figure 9B:
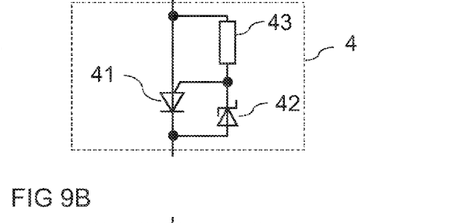

It is commonly known that a thyristor includes a 4-layer structure with a p-doped layer forming the anode, an n-doped layer forming an n-base, a p-doped layer forming a p-base, and an n-doped layer forming the cathode. These four layers form an internal pnp-transistor and an internal npn-transistor. In the type of thyristor illustrated in FIG. 9A, such as in the embodiments of FIGS. 7 and 8, the thyristor is a thyristor having the gate terminal connected to the p-base (the base of the internal npn-transistor. However, this thyristor may be replaced by a thyristor 41 as illustrated in FIG. 9B that has the gate terminal connected to the n-base (the base of the internal pnp-transistor). When employing the snap-back unit of FIG. 9A, the anode of the thyristor 41 is coupled to the first circuit node 11, the cathode of the thyristor is coupled to the second circuit node 12, and the resistance element 43 is connected between the gate and the cathode of the thyristor 41.

When employing the snap-back unit of FIG. 9B in the circuit of FIG. 1, the anode of the thyristor 41 is coupled to the first circuit node 11, the cathode is coupled to the second circuit node 12. Further the resistor 43 is connected between the anode and the gate of the thyristor, and the cathode of the Zener diode is connected to the gate of the thyristor 41, and the anode of the Zener diode is connected to the cathode of the thyristor.

Figure 10A:
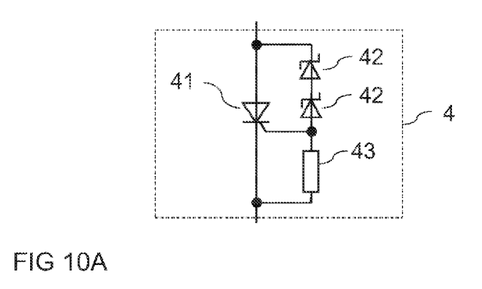
FIGS. 10A and 10B illustrates a fourth embodiment of the snap-back unit and a modification of the fourth embodiment.
Figure 10B:
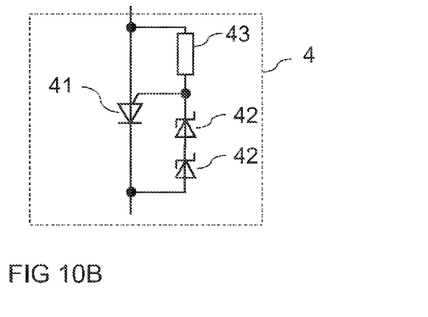

Referring to FIGS. 10A and 10B, the threshold voltage $V4_{TH}$ in the snap-back units of FIGS. 9A and 9B can be increased when a plurality of Zener diodes 42 is connected in series between the gate terminal and the anode or cathode terminal of the thyristor 41, respectively.

The maximum voltage $V4_{MAX}$ of the embodiments of FIG. 9 and FIG. 10 corresponds to the Zener voltage of a single Zener diode 42 or a plurality of Zener diodes 42 plus the voltage between the gate and cathode of the thyristor 41 that leads to triggering the thyristor 41. In these embodiments the self triggering voltage of the thyristor 41 may be higher than the above mentioned $V4_{MAX}$.

Figure 11:
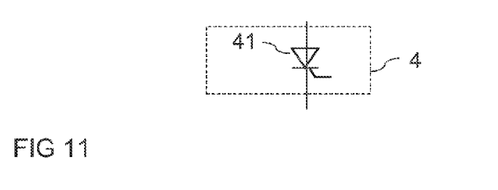
FIG. 11 illustrates a fifth embodiment of the snap-back unit.

According to a further embodiment illustrated in FIG. 11, the snap-back unit only includes a thyristor 41. In this embodiment, the threshold voltage $V4_{TH}$ and the maximum voltage $V4_{MAX}$ are determined solely by the properties of the thyristor. The maximum voltage $V4_{MAX}$ corresponds to the self-triggering voltage of the thyristor 41.

Figure 12:
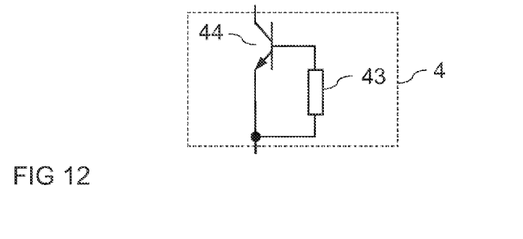
FIG. 12 illustrates a sixth embodiment of the snap-back unit.

FIG. 12 illustrates yet another embodiment of a snap-back unit 4. The snap-back unit of FIG. 12 includes a bipolar transistor 44 having its collector-emitter path C-E connected between the load terminals of the snap-back unit 4. A resistor 43 is connected between the base terminal B and the emitter terminal E of the transistor 44.

In each of the embodiments including the resistor 43, the resistor 43 can be implemented as a discrete resistor, or can be implemented as a device internal resistor formed by the device internal base region in case the thyristor gate terminal and the anode or cathode terminal are shorted, or can be implemented as an inevitable parasitic ohmic resistance of a connection line or, in the embodiment of FIG. 12, as a device internal resistor formed by the device internal base region in case the base and emitter device terminals are shorted.

As used herein, the terms "having," "containing," "including," "comprising," and the like are open ended terms that indicate the presence of stated elements or features, but do not preclude additional elements or features. The articles "a," "an," and "the," are intended to include the plural as well as the singular, unless the context clearly indicates otherwise.

As used herein, specific doping types, such as n-doping or p-doping are only exemplary. Of course, any semiconductor region having a specific doping concentration can be replaced by a semiconductor region having a complementary doping concentration. Further, in circuits that include semiconductor devices of a specific type, such as n-type or p-type devices, these devices can be replaced by complementary devices when the polarity of the supply voltages is changed.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A clamping circuit, comprising:
   a clamping element comprising a control terminal and a load path coupled between a first circuit node and a second circuit node; and
   a control circuit coupled between the first circuit node and the second circuit node and coupled to the control terminal of the clamping element,
   the control circuit comprising a snap-back unit comprising two load terminals that are functionally coupled between the first circuit node and the control terminal of the clamping element to control the clamping element via the control terminal, the snap-back unit having a current-voltage characteristic that transitions from a positive slope to a negative slope when a voltage between the two load terminals reaches a given threshold value.

2. The clamping circuit of claim 1, wherein the snap-back unit further comprises a further voltage limiting element coupled between the load terminals of the snap-back unit.

3. The clamping circuit of claim 2, wherein the further voltage limiting element comprises a Zener diode or an avalanche diode.

4. The clamping circuit of claim 2, wherein the snap-back unit further comprises a resistive element coupled in series with the further voltage limiting element.

5. The clamping circuit of claim 1, wherein the clamping element comprises a transistor.

6. The clamping circuit of claim 5, wherein the transistor comprises a MOSFET, an IGBT, or a BJT.

7. The clamping circuit of claim 1, wherein the control circuit further comprises a resistive element coupled between the control terminal of the clamping element and the second circuit node.

8. The clamping circuit of claim 1, further comprising a clamping voltage adjusting element coupled in series with the snap-back unit.

9. The clamping unit of claim 8, wherein the clamping voltage adjusting element comprises a Zener diode or an avalanche diode.

10. A clamping circuit, comprising:
    a clamping element comprising a control terminal and a load path coupled between a first circuit node and a second circuit node;
    a control circuit coupled between the first circuit node and the second circuit node and coupled to the control terminal of the clamping element, the control circuit comprising a snap-back unit comprising two load terminals and only coupled between the first circuit node and the control terminal of the clamping element, the snap-back unit having a current-voltage characteristic that transitions from a positive slope to a negative slope when a voltage between the two load terminals reaches a given threshold value; and
    a clamping voltage adjusting element coupled in series with the snap-back unit.

11. The clamping unit of claim 10, wherein the clamping voltage adjusting element comprises a Zener diode or an avalanche diode.

12. A clamping circuit, comprising:
- a clamping element comprising a control terminal and a load path coupled between a first circuit node and a second circuit node; and
- a control circuit coupled between the first circuit node and the second circuit node and coupled to the control terminal of the clamping element,
- the control circuit comprising a snap-back unit comprising two load terminals that are functionally coupled between the first circuit node and the control terminal of the clamping element to control the clamping element via the control terminal, the snap-back unit having an electrical resistance between the two load terminals and configured to reduce the electrical resistance when a voltage between the two load terminals reaches a given threshold value, wherein the snap-back unit comprises a thyristor.

13. The clamping circuit of claim 12, wherein the thyristor comprises a gate terminal and wherein the snap-back unit further comprises:
- a further voltage limiting element coupled between the gate terminal and one of the load terminals, and a resistive element coupled between the gate terminal and the other one of the load terminals.

14. The clamping circuit of claim 13, wherein the further voltage limiting element comprises a Zener diode or an avalanche diode.

15. A clamping circuit, comprising:
- a clamping element comprising a control terminal and a load path coupled between a first circuit node and a second circuit node; and
- a control circuit coupled between the first circuit node and the second circuit node and coupled to the control terminal of the clamping element,
- the control circuit comprising a snap-back unit comprising two load terminals and only that are functionally coupled between the first circuit node and the control terminal of the clamping element to control the clamping element via the control terminal, the snap-back unit having an electrical resistance between the two load terminals and configured to reduce the electrical resistance when a voltage between the two load terminals reaches a given threshold value, wherein the snap-back unit comprises:
  - a bipolar transistor with a collector-emitter path connected between the load terminals of the snap-back unit, and
  - a resistor connected between a base terminal and an emitter terminal of the bipolar transistor.

16. A method of protecting a circuit coupled to a clamping circuit comprising a clamping element comprising a control terminal and a load path coupled between a first circuit node and a second circuit node and;
- applying an ESD pulse to a clamping circuit comprising a clamping element having a control terminal and a load path coupled between a first circuit node and a second circuit node and a control circuit coupled between the first circuit node and the second circuit node and coupled to the control terminal of the clamping element;
- activating a snap-back unit having two load terminals that are functionally coupled between the first circuit node and the control terminal of the clamping element to control the clamping element via the control terminal, wherein the snap-back unit has a current-voltage characteristic that transitions from a positive slope to a negative slope when a voltage between the two load terminals reaches a given threshold value exceeding a voltage threshold, and wherein activating comprises exceeding the given threshold value with the ESD pulse; and
- clamping a voltage between the first circuit node and the second circuit node after the ESD pulse exceeds the given threshold value.

17. The method of claim 16, wherein the snap-back unit comprises a thyristor, and activating the snap-back unit comprises activating a thyristor.

18. A clamping circuit, comprising:
- a clamping element comprising a control terminal and a load path coupled between a first circuit node and a second circuit node; and
- a control circuit coupled between the first circuit node and the second circuit node and coupled to the control terminal of the clamping element,
- the control circuit comprising a snap-back unit comprising two load terminals that are functionally coupled between the first circuit node and the control terminal of the clamping element to control the clamping element via the control terminal, wherein the snap-back unit is configured to
  - start conducting a current when a voltage between the load terminals reaches a threshold value,
  - increase the voltage between the load terminals as the current increases, and
  - change to a current conducting state with a lower voltage difference between the load terminals after a trigger voltage between the load terminals has been reached.

19. The clamping circuit of claim 18, wherein the snap-back unit comprises a thyristor.

20. The clamping circuit of claim 19, wherein
- the thyristor comprises a gate terminal; and
- the snap-back unit further comprises a further voltage limiting element coupled between the gate terminal and one of the load terminals, and a resistive element coupled between the gate terminal and the other one of the load terminals.

21. The clamping circuit of claim 20, wherein the further voltage limiting element comprises a Zener diode or an avalanche diode.

* * * * *

UNITED STATES PATENT AND TRADEMARK OFFICE
CERTIFICATE OF CORRECTION

| | |
|---|---|
| PATENT NO. | : 8,854,103 B2 |
| APPLICATION NO. | : 13/432411 |
| DATED | : October 7, 2014 |
| INVENTOR(S) | : Joost Willemen |

Page 1 of 1

It is certified that error appears in the above-identified patent and that said Letters Patent is hereby corrected as shown below:

In the Claims,

In Col. 9, line 36, claim 15, delete "and only".

Signed and Sealed this
Tenth Day of March, 2015

Michelle K. Lee
*Deputy Director of the United States Patent and Trademark Office*